(12) United States Patent
Yang et al.

(10) Patent No.: US 11,818,899 B2
(45) Date of Patent: Nov. 14, 2023

(54) SEMICONDUCTOR DEVICE INCLUDING LAYERS WITH DIFFERENT CHALCOGEN COMPOUNDS AND SEMICONDUCTOR APPARATUS INCLUDING THE SAME

(71) Applicant: Samsung Electronics Co., Ltd., Suwon-si (KR)

(72) Inventors: Wooyoung Yang, Suwon-si (KR); Bonwon Koo, Suwon-si (KR); Chungman Kim, Suwon-si (KR); Kwangmin Park, Seoul (KR); Hajun Sung, Hwaseong-si (KR); Dongho Ahn, Hwaseong-si (KR); Changseung Lee, Yongin-si (KR); Minwoo Choi, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/244,212

(22) Filed: Apr. 29, 2021

(65) Prior Publication Data
US 2022/0140003 A1 May 5, 2022

(30) Foreign Application Priority Data

Nov. 3, 2020 (KR) .................. 10-2020-0145526
Jan. 5, 2021 (KR) .................. 10-2021-0001064

(51) Int. Cl.
*H10B 63/00* (2023.01)
*G11C 13/00* (2006.01)
(Continued)

(52) U.S. Cl.
CPC ......... *H10B 63/24* (2023.02); *G11C 13/0004* (2013.01); *H10B 61/10* (2023.02);
(Continued)

(58) Field of Classification Search
CPC ............... H01L 27/2427; H01L 27/224; H01L 27/2481; H01L 43/02; H01L 43/12;
(Continued)

(56) References Cited

U.S. PATENT DOCUMENTS 8,654,560 B2 2/2014 Deweerd et al.
9,305,976 B2 4/2016 Cho
(Continued)

FOREIGN PATENT DOCUMENTS

KR 10-2016-0022046 A 2/2016
KR 10-1889600 B1 8/2018
WO WO-2019-066769 A1 4/2019

*Primary Examiner* — Jerome Leboeuf
(74) *Attorney, Agent, or Firm* — Harness, Dickey & Pierce, P.L.C.

(57) ABSTRACT

A chalcogen compound layer exhibiting ovonic threshold switching characteristics, a switching device, a semiconductor device, and/or a semiconductor apparatus including the same are provided. The switching device and/or the semiconductor device may include two or more chalcogen compound layers having different energy band gaps. Alternatively, the switching device and/or semiconductor device may include a chalcogen compound layer having a concentration gradient of an element of boron (B), aluminum (Al), scandium (Sc), manganese (Mn), strontium (Sr), and/or indium (In) in a thickness direction thereof. The switching device and/or a semiconductor device may exhibit stable switching characteristics while having a low off-current value (leakage current value).

15 Claims, 9 Drawing Sheets

(51) Int. Cl.
*H10B 61/00* (2023.01)
*H10N 50/01* (2023.01)
*H10N 50/80* (2023.01)
*H10N 70/20* (2023.01)
*H10N 70/00* (2023.01)

(52) U.S. Cl.
CPC ............. *H10B 63/84* (2023.02); *H10N 50/01* (2023.02); *H10N 50/80* (2023.02); *H10N 70/063* (2023.02); *H10N 70/231* (2023.02); *H10N 70/24* (2023.02); *H10N 70/25* (2023.02); *H10N 70/8413* (2023.02); *H10N 70/8825* (2023.02); *H10N 70/8828* (2023.02); *H10N 70/8833* (2023.02); *H10N 70/8836* (2023.02)

(58) Field of Classification Search
CPC ......... H01L 45/06; H01L 45/08; H01L 45/10; H01L 45/126; H01L 45/143; H01L 45/144; H01L 45/146; H01L 45/147; H01L 45/1675; H01L 45/1233; H01L 45/1625; H01L 45/04; H01L 45/142; H01L 45/1253; G11C 13/0004; H10B 63/24; H10B 61/10; H10B 63/84; H10N 50/01; H10N 50/80; H10N 70/063; H10N 70/231; H10N 70/24; H10N 70/25; H10N 70/8413; H10N 70/8825; H10N 70/8828; H10N 70/8833; H10N 70/8836; H10N 70/826; H10N 70/026; H10N 70/20; H10N 70/841; H10N 70/8822

See application file for complete search history.

(56) References Cited

U.S. PATENT DOCUMENTS

| | | | | |
|---|---|---|---|---|
| 2006/0002173 | A1* | 1/2006 | Parkinson | G11C 13/0004 365/148 |
| 2009/0180314 | A1* | 7/2009 | Liu | H01L 45/144 257/E47.001 |
| 2016/0336378 | A1* | 11/2016 | Ohba | G11C 13/0002 |
| 2019/0058006 | A1 | 2/2019 | Karpov et al. | |
| 2019/0115393 | A1* | 4/2019 | Cheng | H01L 45/141 |
| 2019/0252609 | A1* | 8/2019 | Sei | H01L 45/147 |
| 2021/0043838 | A1* | 2/2021 | Tortorelli | H01L 45/08 |
| 2021/0074825 | A1 | 3/2021 | Sharma et al. | |

* cited by examiner

SEMICONDUCTOR DEVICE INCLUDING LAYERS WITH DIFFERENT CHALCOGEN COMPOUNDS AND SEMICONDUCTOR APPARATUS INCLUDING THE SAME

CROSS-REFERENCE TO RELATED APPLICATIONS

This application is based on and claims priority under 35 U.S.C. § 119 to Korean Patent Application Nos. 10-2020-0145526, filed on Nov. 3, 2020, and 10-2021-0001064, filed on Jan. 5, 2021, in the Korean Intellectual Property Office, the disclosures of which are incorporated by reference herein in their entirety.

BACKGROUND

1. Field

The present disclosure relates to semiconductor devices including a chalcogen compound layer and a semiconductor apparatus including the semiconductor devices.

2. Description of the Related Art

The demand for high integration of semiconductor devices is increasing according to the tendency of light weight and reducing sizes of electronic products. Accordingly, various types of semiconductor devices have been proposed, and as an example, a semiconductor device including a variable resistance layer and a selection device layer has been proposed.

SUMMARY

Provided are chalcogen compound layers exhibiting ovonic threshold switching characteristics and switching devices including the chalcogen compound layers.

Provided are semiconductor devices and/or semiconductor apparatuses having low off-current and high reliability (endurance).

Additional aspects will be set forth in part in the description which follows and, in part, will be apparent from the description, or may be learned by practice of the presented embodiments of the disclosure.

According to an aspect of an embodiment, a semiconductor device includes a selection device layer exhibiting ovonic threshold switching characteristics. The selection device layer may include two or more chalcogen compound layers having different energy band gaps.

Specifically, the selection device layer may include a first chalcogen compound layer and a second chalcogen compound layer having different compositions from each other, and each of the first and second chalcogen compound layers may each independently include a first element including germanium (Ge) and/or tin (Sn), and a second element including sulfur (S), selenium (Se), and/or tellurium (Te).

In some embodiments, the first chalcogen compound layer and/or the second chalcogen compound layer may further each independently include a third element including one or more selected from the group consisting of arsenic (As), antimony (Sb), silicon (Si), and bismuth (Bi). Also, the second chalcogen compound layer may further include a fourth element including one or more selected from the group consisting of boron (B), aluminum (Al), scandium (Sc), manganese (Mn), strontium (Sr), and indium (In), and the first chalcogen compound layer may further include a fifth element including one or more selected from the group consisting of carbon (C), nitrogen (N), oxygen (O), phosphorus (P), and sulfur (S).

In some embodiments, the first chalcogen compound layer may have an energy band gap of 0.1 eV or more and 1.0 eV or less than that of the second chalcogen compound layer.

In some embodiments, the first chalcogen compound layer may include a compound of Formula 1, Formula 3 and/or Formula 4, and the second chalcogen compound layer may include a compound of Formula 1 and/or Formula 2.

$$A_a B_b C_c \qquad \text{[Formula 1]}$$

$$A_a B_b C_c D_d \qquad \text{[Formula 2]}$$

$$A_a B_b \qquad \text{[Formula 3]}$$

$$A_a B_b C_c E_e \qquad \text{[Formula 4]}$$

In Formula 1, Formula 2, Formula 3, or Formula 4, A is a first element, B is a second element, C is a third element, D is a fourth element, E is a fifth element, $a+b+c=1$ in Formula 1, $a+b+c+d=1$ in Formula 2, $a+b=1$ in Formula 3, and $a+b+c+e=1$ in Formula 4. In Formula 1, Formula 2, or Formula 4, $0.05 \leq a \leq 0.30$, $0.20 \leq b \leq 0.70$, $0.05 \leq c \leq 0.50$, $0.01 \leq d \leq 0.10$, and $0.01 \leq e \leq 0.10$. In Formula 3, $0.05 \leq a \leq 0.70$ and $0.05 \leq b \leq 0.70$.

In some embodiments, the semiconductor device may further include a variable resistance layer. Specifically, the semiconductor device may further include a first electrode layer, a second electrode layer, and a third electrode layer, and the selection device layer may be arranged between the first electrode layer and the second electrode layer, and the variable resistance layer may be arranged between the second electrode layer and the third electrode layer.

In some embodiments, the variable resistance layer may include a material capable of reversibly changing a phase between crystalline and amorphous according to a temperature change. The variable resistance layer may include a compound in which Te and/or Se and one or more elements from the group consisting of Ge, Sb, Bi, Pb, Sn, Ag, As, S, Si, In, Ti, Ga, P, B, O and C are combined.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
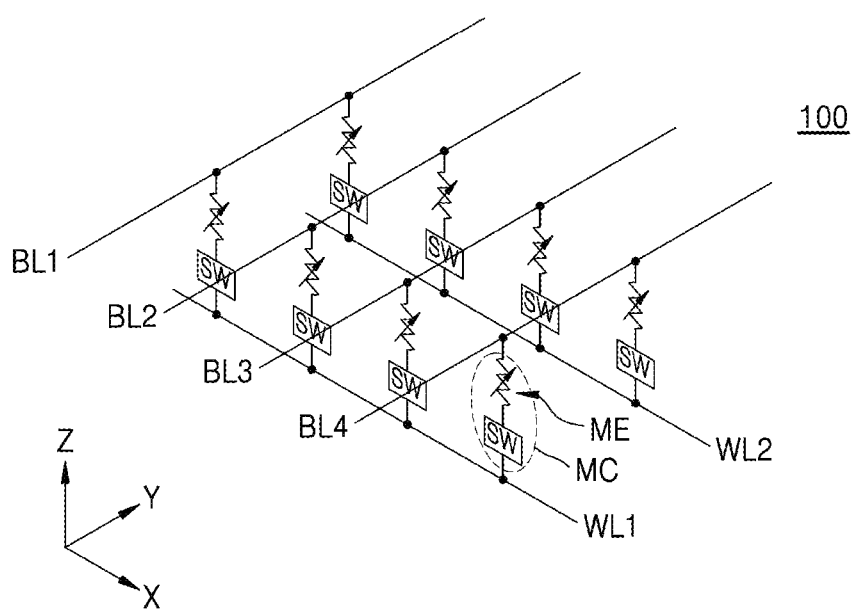
FIG. 1 is an equivalent circuit diagram of a semiconductor apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

The terminologies used herein are for the purpose of describing embodiments only and are not intended to be limiting of embodiments. When a position of an element is described using an expression "above" or "on", the position of the element may include not only the element being "immediately on/under/left/right in a contact manner" but also being "on/under/left/right in a non-contact manner".

The singular forms include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

It will be understood that, although the terms "first", "second", "third" etc. may be used herein to describe various elements, these terms are only used to distinguish one element from another, and sequence and type of these elements should not be limited by these terms. Also, the terms such as "unit", "means", "module", " . . . unit" refer to a unit of a comprehensive configuration that processes a certain function or operation, and may be realized by hardware, software, or a combination of hardware and software.

Hereafter, inventive concepts will be described more fully with reference to the accompanying drawings. In the drawings, like reference numerals refer to like elements, and sizes (widths and thicknesses of layers and regions) may be exaggerated for clarity and convenience of explanation. The embodiments of inventive concepts are capable of various modifications and may be embodied in many different forms.

According to one aspect of an embodiment, a semiconductor device having high reliability (durability) and a semiconductor apparatus including the same are provided. Specifically, the semiconductor apparatus may include a plurality of semiconductor devices between two separated electrode lines, and the semiconductor devices may include a variable resistance layer and a selection device layer electrically connected to each other. In addition, the semiconductor apparatus may have a three-dimensional structure in which two electrode lines have crossing points. The semiconductor device and/or the semiconductor apparatus may be a memory device.

FIG. 1 is an equivalent circuit diagram of a semiconductor apparatus 100 according to an embodiment.

Referring to FIG. 1, the semiconductor apparatus 100 may include a plurality of first electrode lines WL1 and WL2 extending parallel to each other in a first direction (X direction). In addition, the semiconductor apparatus 100 may include second electrode lines BL1, BL2, BL3, and BL4 extending parallel to each other in a second direction and separated from the first electrode lines WL1 and WL2 in a third direction (Z direction). Semiconductor devices MCs may be arranged between the first electrode lines WL1 and WL2 and the second electrode lines BL1, BL2, BL3, and BL4. Specifically, the semiconductor devices MC may be electrically connected to the first electrode lines WL1 and WL2 and the second electrode lines BL1, BL2, BL3, and BL4, and may be arranged at crossing points therebetween, respectively. In addition, each of the semiconductor devices MCs may include a variable resistance layer ME and a selection device layer SW that are electrically connected to each other. For example, the variable resistance layer ME and the selection device layer SW may be connected in series in the third direction (Z direction), the selection device layer SW may be electrically connected to one of the first electrode lines WL1 and WL2 and the second electrode lines BL1, BL2, BL3, and BL4, and the variable resistance layer ME may be electrically connected to the other one thereof.

A driving method of the semiconductor apparatus 100 will be briefly described. A voltage is applied to the variable resistance layer ME of the semiconductor device MC through the first electrode lines WL1 and WL2 and the second electrode lines BL1, BL2, BL3, and BL4, and then, a current may flow in the semiconductor device MC. In detail, an arbitrary semiconductor device MC may be addressed by the selection of the first electrode lines WL1 and WL2 and the second electrode lines BL1, BL2, BL3, and BL4, and the semiconductor device MC may be programmed by applying a desired and/or alternatively predetermined signal between the first electrode lines WL1 and WL2 and the second electrode lines BL1, BL2, BL3, and BL4. In addition, by measuring a current value through the second electrode lines BL1, BL2, BL3, and BL4, information according to a resistance value of the variable resistance layer ME of the corresponding semiconductor device MC, that is, programmed information, may be read.

The variable resistance layer ME may store information. Specifically, the resistance value of the variable resistance layer ME may vary according to an applied voltage. The semiconductor device MC may store and erase digital information, such as '0' or '1', according to the change in resistance of the variable resistance layer ME. For example, the semiconductor device MC may write data in a high resistance state of the variable resistance layer ME as '0' and a low resistance state as '1'. Here, writing from the high resistance state '0' to the low resistance state '1' may be referred to as a 'set operation', and writing from the low resistance state '1' to the high resistance state '0' may be referred to as a 'reset operation'.

The selection device layer SW may perform a role of selecting (addressing) a corresponding semiconductor device MC by controlling the flow of current with respect to the semiconductor device MC electrically connected to the corresponding selection device layer SW. Specifically, the selection device layer SW may include a material of which a resistance changes according to the magnitude of a voltage applied to both ends of the selection device layer SW. For example, the selection device layer SW may have ovonic threshold switching characteristics.

Figure 2:
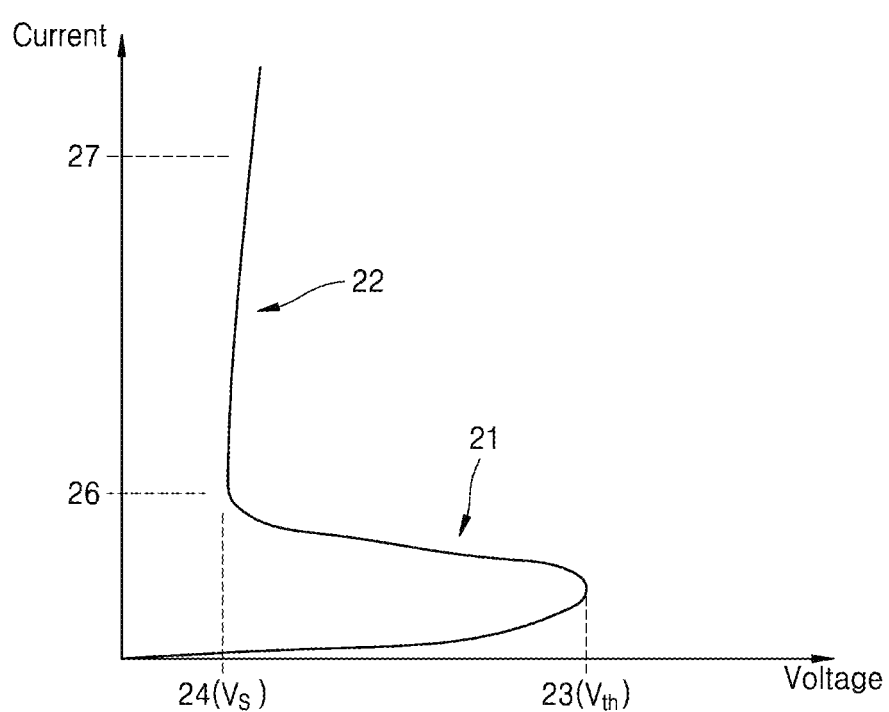
FIG. 2 is a graph schematically showing a voltage-current curve of a material having ovonic threshold switching characteristics.

FIG. 2 is a graph schematically showing a voltage-current curve of a selection device layer SW having ovonic threshold switching characteristics. Referring to FIG. 2, a first curve 21 represents a voltage-current relationship in a state that little current flows through the selection device layer SW. When a voltage gradually increases from a state in which a voltage and a current are 0, the selection device layer SW is in a high resistance state until the voltage reaches a threshold voltage $V_{th}$ (a first voltage level 23) and almost no current may flow therethrough. However, as soon as the voltage exceeds the threshold voltage $V_{th}$, the selection device layer SW may be in a low resistance state, and a current flowing through the selection device layer SW may rapidly increase, and a voltage applied to the selection device layer SW decreases to a saturation voltage $V_s$ (a second voltage level 24). A second curve 22 shows a voltage-current relationship in a state in which a current flows more smoothly through the selection device layer SW. As the current flowing through the selection device layer SW becomes greater than a first current level 26, a voltage applied to the selection device layer SW may slightly increase than the second voltage level 24. For example, while a current flowing through the selection device layer SW significantly increases from the first current level 26 to a second current level 27, a voltage applied to the selection device layer SW may slightly increase compared to the second voltage level 24. In other words, once a current flows through the selection device layer SW, the voltage applied to the selection device layer SW may be maintained at a saturation voltage $V_S$. If the current decreases below a sustain current level (the first current level 26), the selection device layer SW is converted to a high resistance state again, and the current may be effectively blocked or limited until the voltage increases to the threshold voltage $V_{th}$. Due to this characteristic, the selection device layer SW may function as a switching device having a threshold voltage $V_{th}$ of the first voltage level 24).

However, even when a voltage less than the threshold voltage $V_{th}$ is applied to the semiconductor device (when the semiconductor device is in an off-state), as shown in FIG. 2, a certain level of current may flow in the selection device layer SW. When the off-state current (leakage current) is great, the semiconductor apparatus may be difficult to be operated at one time as the number of semiconductor devices included in the semiconductor apparatus increases. In addition, when the threshold voltage $V_{th}$ changes according to cumulative use-time of the semiconductor device and the number of cumulative on/off times or a ratio of on-current to off-current ($I_{on}/I_{off}$) changes, the reliability and endurance of the selection device layer SW may be deteriorated.

The selection device layer SW according to an embodiment may include two or more chalcogen compound layers, and thus, stable switching characteristics may be realized while having a low off-current value (leakage current value). Specifically, the selection device layer SW according to an embodiment may include each independently a first element including germanium (Ge) and/or tin (Sn) and a second element including sulfur (S), selenium (Se), and/or tellurium (Te), and two or more chalcogen compound layers having different compositions.

The one-layer selection device layer SW including a three-component GeAsSe chalcogen compound may have ovonic threshold switching) characteristics, but may have a high off-current value (leakage current value) and insufficient durability, and thus, it is difficult to apply the one-layer selection device layer SW to an actual semiconductor device. The selection device layer SW according to an embodiment includes two or more chalcogen compound layers having different energy band gaps Eg and/or different compositions, and thus, may have a low off-current value (leakage current value) and improved durability. Although not intending to be bound by a specific theory, the selection device layer SW according to an embodiment may have a low leakage current value and improved durability by controlling electron movement between the chalcogen compound layers having ovonic threshold switching characteristics through an energy band gap difference therebetween.

Figure 3A:
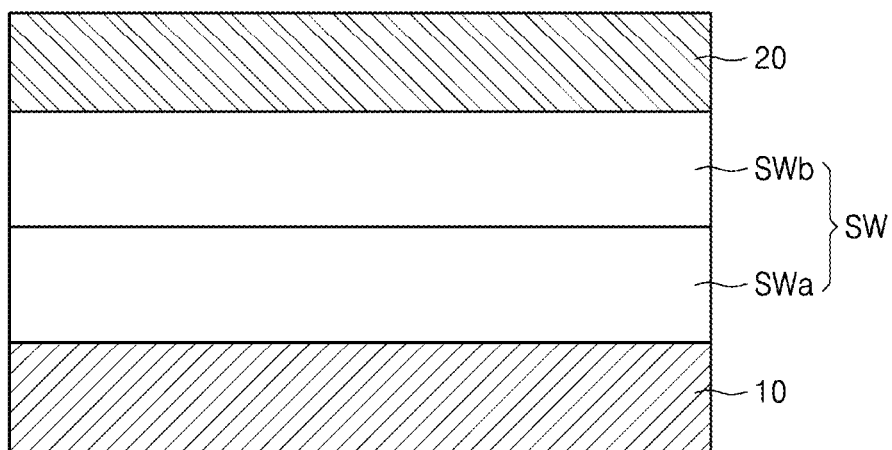
FIGS. 3A to 3C are schematic diagrams of a semiconductor device and/or a switching device according to embodiments.
Figure 3B:
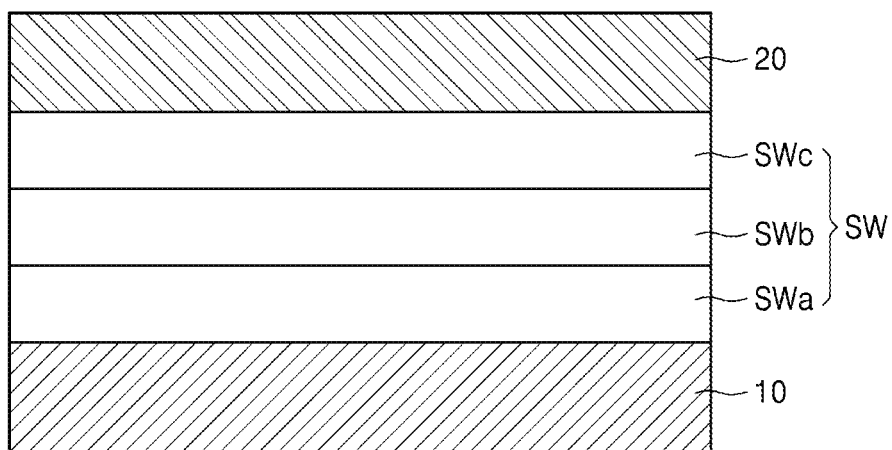
Figure 3C:
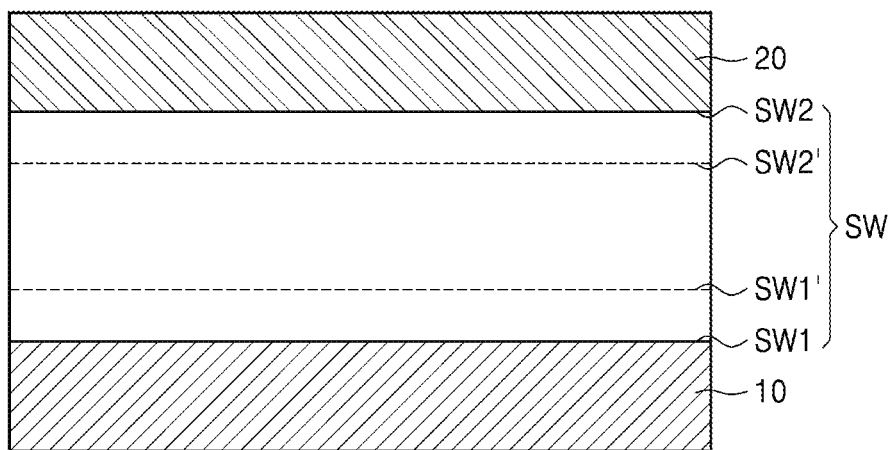

FIGS. 3A to 3C are schematic diagrams of semiconductor devices according to embodiments. Referring to FIG. 3A, the selection device layer SW may include two or more chalcogen compound layers having energy band gaps different from each other. In other words, a first chalcogen compound layer SWa may have a greater energy band gap than a second chalcogen compound layer SWb. For example, the first chalcogen compound layer SWa may have an energy band gap greater than that of the second chalcogen compound layer SWb by 0.1 eV or more, 0.2 eV or more, 0.3 eV or more, 0.4 eV or more, 0.5 eV or more, 0.6 eV or more, 1.0 eV or less, 0.9 eV or less, 0.8 eV or less, or 0.7 eV or less.

The first chalcogen compound layer SWa and the second chalcogen compound layer SWb may include each independently a first element including germanium (Ge) and/or tin (Sn) and a second element including sulfur (S), selenium (Se), and/or tellurium (Te).

The content of the first element in the first chalcogen compound layer SWa and the second chalcogen compound layer SWb may each independently be 5.0 at % or more and 30.0 at % or less based on the total element content. For example, the content of the first element may be 7.0 at % or more, 10.0 at % or more, 25.0 at % or less, 23.0 at % or less, or 20.0 at % or less based on the total element content.

The content of the second element in the first chalcogen compound layer SWa and the second chalcogen compound layer SWb may each independently be greater than 0.0 at % and less than 70.0 at % based on the total element. For example, the content of the second element may be 10.0 at % or more, 15.0 at % or more, 20.0 at % or more, 25.0 at % or more, 30.0 at % or more, 35.0 at % or more, 40.0 at % or more, 65.0 at % or less of the total element content, 60.0 at % or less, or 55.0 at % or less.

The first chalcogen compound layer SWa and/or the second chalcogen compound layer SWb may further each independently include a third element selected from the group consisting of arsenic (As), antimony (Sb), silicon (Si), and bismuth (Bi). The content of the third element in the first chalcogen compound layer SWa and/or the second chalcogen compound layer SWb may each independently be 5.0 at % or more and 50.0 at % or less based on the total element content. For example, the content of the third element may be 7.0 at % or more, 10.0 at % or more, 15.0 at % or more, 20.0 at % or more, 45.0 at % or less, 40.0 at % or less, or 35.0 at % or less based on the total element.

The second chalcogen compound layer SWb may further include a metal dopant. Specifically, the second chalcogen compound layer SWb may further include a fourth element selected from the group consisting of boron (B), aluminum (Al), scandium (Sc), manganese (Mn), strontium (Sr), and indium (In). The content of the fourth element in the second chalcogen compound layer SWb may be 0.1 at % or more and 10.0 at % or less based on the total element content. For example, the content of the third element may be 0.5 at % or more, 1.0 at % or more, 1.5 at % or more, 2.0 at % or more, 7.0 at % or less, 6.0 at % or less, or 5.0 at % or less of the total element.

The first chalcogen compound layer SWa may further include a non-metal dopant. Specifically, the first chalcogen compound layer SWa may further include a fifth element selected from the group consisting of carbon (C), nitrogen (N), oxygen (O), phosphorus (P), and sulfur (S). The content of the fifth element content in the first chalcogen compound layer SWa may be 0.1 at % or more and 10.0 at % or less based on the total element content. For example, the content of the fifth element may be 0.5 at % or more, 1.0 at % or more, 1.5 at % or more, 2.0 at % or more, 7.0 at % or less, 6.0 at % or less, or 5.0 at % or less based on the total element content.

The first chalcogen compound layer SWa may include a compound of Formula 1, Formula 3, and/or Formula 4. In addition, the second chalcogen compound layer SWb may include a compound of Formula 1 and/or Formula 2.

$$A_aB_bC_c \qquad \text{[Formula 1]}$$

$$A_aB_bC_cD_d \qquad \text{[Formula 2]}$$

$$A_aB_b \qquad \text{[Formula 3]}$$

$$A_aB_bC_cE_e \qquad \text{[Formula 4]}$$

In Formula 1, Formula 2, Formula 3, or Formula 4, A represents the first element, B represents the second element, C represents the third element, D represents the fourth element, E represents the fifth element, and a+b+c=1 in Formula 1, a+b+c+d=1 in Formula 2, a+b=1 in Formula 3, and a+b+c+e=1 in Formula 4. In Formula 1, Formula 2, or Formula 4, $0.05 \le a \le 0.30$, $0.20 \le b \le 0.70$, $0.05 \le c \le 0.50$, $0.01 \le d \le 0.10$, and $0.01 \le e \le 0.10$. In Formula 3, $0.05 \le a \le 0.70$ and $0.05 \le b \le 0.70$.

According to an embodiment, the second chalcogen compound layer SWb may include a compound of Formula 1, and the first chalcogen compound layer SWa may include a compound of Formula 3 and/or a compound of Formula 4. According to another embodiment, the second chalcogen compound layer SWb may include a compound of Formula 2, and the first chalcogen compound layer SWa may include a compound of Formula 1, a compound of Formula 3, and/or a compound of Formula 4.

The first chalcogen compound layer SWa and/or the second chalcogen compound layer SWb may have an appropriate thickness according to required performance. For example, the thickness of the first chalcogen compound layer SWa and/or the second chalcogen compound layer SWb may be independently 0.5 nm or more, 1.0 nm or more, 2.0 nm or more, 3.0 nm or more, 5.0 nm or more, 7.0 nm or more, 10.0 nm or more, 15.0 nm or more, 30.0 nm or less, 28.0 nm or less, 25.0 nm or less, 23.0 nm or less, 20.0 nm or less, 17.0 nm or less, 15.0 nm or less, 13.0 nm or less, 10.0 nm or less, or 8.0 nm or less. In addition, the second chalcogen compound layer SWb may have a volume ratio (or thickness ratio) of 0.1 times or more, 0.2 times or more, 0.3 times or more, 0.5 times or more, 1.5 times or less, 1.2 times or less, 1.0 times or less, 0.8 times or less with respect to the first chalcogen compound layer SWa.

Referring to FIG. 3B, the selection device layer SW may further include a third chalcogen compound layer SWc arranged adjacent to the second chalcogen compound layer SWb and separated from the first chalcogen compound layer SWa. In other words, the selection device layer SW may have a stack structure of the first chalcogen compound layer SWa/the second chalcogen compound layer SWb/the third chalcogen compound layer SWc.

The third chalcogen compound layer SWc may include the aforementioned compounds of Formula 1, Formula 3, and/or Formula 4. The third chalcogen compound layer SWc may have a greater energy band gap than the second chalcogen compound layer SWb. In addition, the energy band gap of the third chalcogen compound layer SWc may be greater than or equal to that of the first chalcogen compound layer SWa.

According to another embodiment, the selection device layer SW includes a first element, a second element, a third element, and a fourth element, and the fourth element has a concentration gradient in a thickness direction of the selection device layer SW. Specifically, referring to FIG. 3C, the selection device layer SW has a first surface SW1 facing the first electrode 10 and a second surface SW2 facing the second electrode 20, and the fourth element may have a concentration gradient in the thickness direction between the first surface SW1 and the second surface SW2. For example, the concentration of the fourth element in the second surface SW2 may be greater or less than that in the first surface SW1, and the concentration of the fourth element may be 0 in the first surface SW1. In addition, the concentration of the fourth element may be maximum at a desired and/or alternatively predetermined thickness position (between SW1' and SW2') and may decrease or become 0 toward the first surface SW1 and/or the second surface SW2. In addition, the concentration gradient of the fourth element may appear from positions SW1' and SW2' separated by a desired and/or alternatively predetermined thickness from the first surface SW1 (or the second surface SW2). In other words, the fourth element may not be at the first surface SW1 (or the second surface SW2) and/or between a desired and/or alternatively predetermined thickness from the first surface SW1 (and/or the second surface SW2) to the position SW1' and/or SW2'. The positions SW1' and SW2' are not particularly limited, but, for example, may be more than 0%, 1% or more, 3% or more, 5% or more, 7% or more, 10% or more, 15% or more, 20% or more, 75% or less, 70% or less, 65% or less, 60% or less, 58% or less, 55% or less, 53% or less, 50% or less, 48% or less, 45% or less, 43% or less, 40% or less, 38% or less, or 35% or less of the total thickness of the selection device layer SW from the first electrode 10 to the second electrode 20, respectively.

The selection device layer SW may further include a fifth element, and the fifth element may also have a concentration gradient in the thickness direction of the selection device layer SW. For example, the concentration of the fifth element in the first surface SW1 may be greater or less than in the second surface SW2, and the concentration of the fifth element in the second surface SW2 may be 0. In addition, the fifth element may have a minimum concentration or 0 at a desired and/or alternatively predetermined thickness position (between 'SW1' and 'SW2'). The direction of the concentration gradient of the fifth element may be a direction different from that of the fourth element, and For example, may be in the opposite direction to the fourth element. Specifically, the concentration of the fifth element may decrease from the first surface SW1 to the second surface SW2, and the concentration of the fourth element may increase.

The selection device layer SW according to an embodiment has high thermal stability and may be less damaged or deteriorated in a manufacturing process of a semiconductor device, etc. Specifically, a crystallization temperature of each chalcogen compound layer or selection device layer SW may be 350° C. or higher and 600° C. or less. For example, the crystallization temperature may be 380° C. or higher, 400° C. or higher, 580° C. or less, or 550° C. or less. In addition, a sublimation temperature of each of the chalcogen compound layer and the selection device layer SW may be 250° C. or higher and 400° C. or less. For example, the sublimation temperature may be 280° C. or higher, 300° C. or higher, 380° C. or less, or 350° C. or less.

Figure 4A:
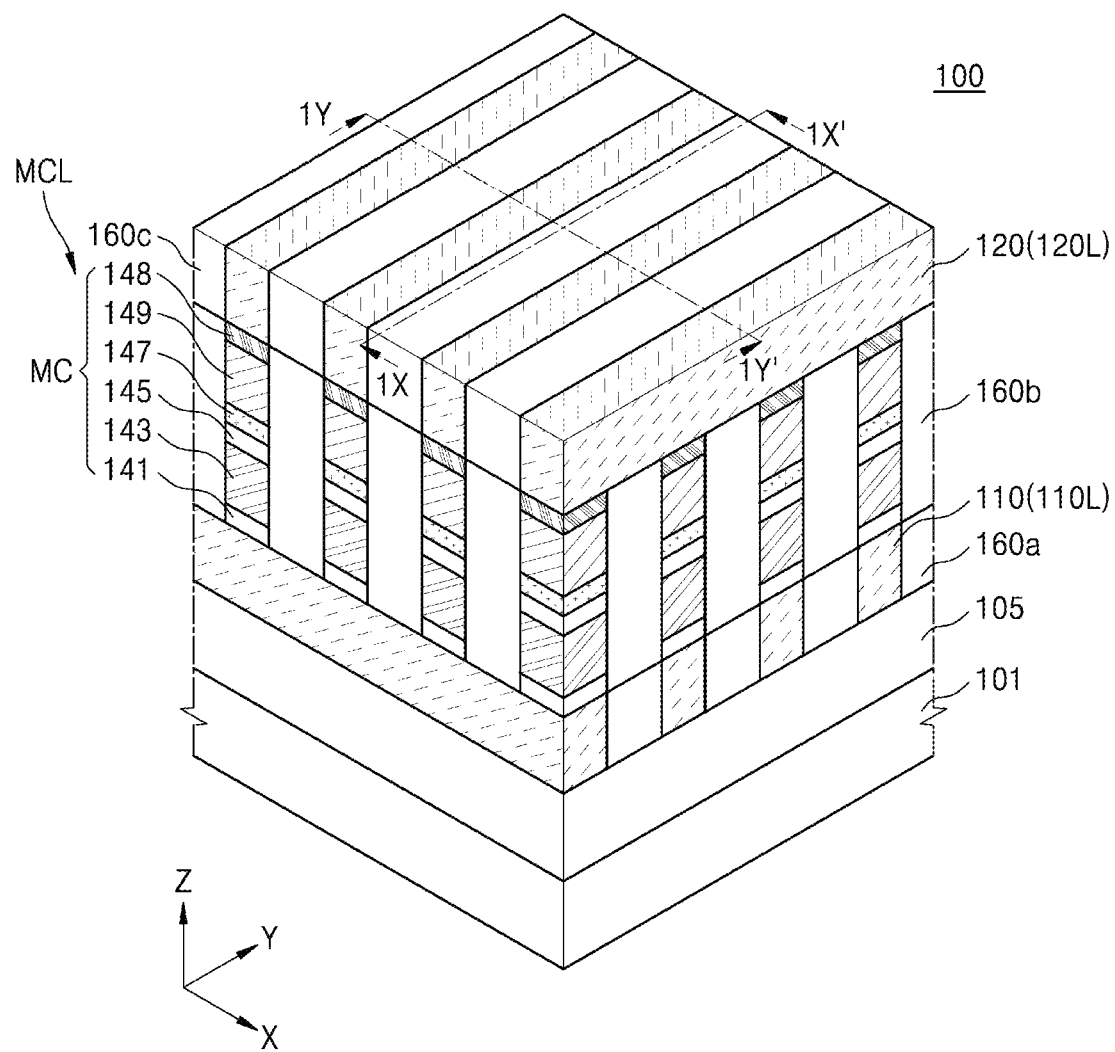
FIG. 4A is a perspective view of a semiconductor apparatus according to an embodiment.
Figure 4B:
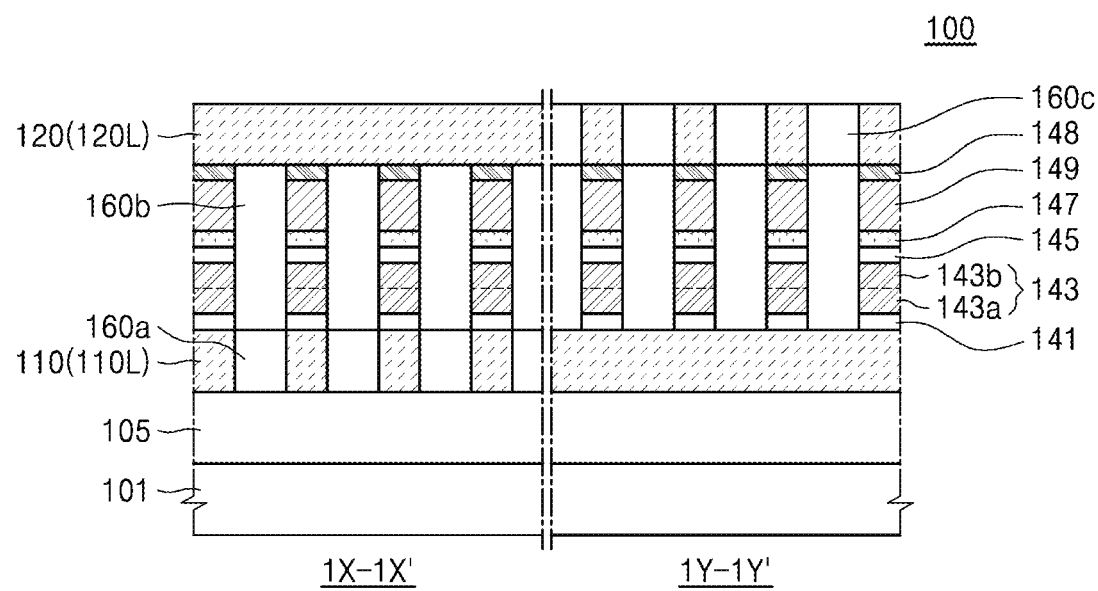
FIG. 4B is a cross-sectional view taken along lines 1X-1X' and 1Y-1Y' of the semiconductor apparatus of FIG. 3A.

A semiconductor device and a semiconductor apparatus according to an embodiment may further include electrodes electrically connecting each component. FIGS. 4A and 4B are perspective and cross-sectional views of a semiconductor apparatus 100 according to an embodiment. Referring to FIGS. 4A and 4B, the semiconductor apparatus 100 may include a first electrode line layer 110L, a second electrode line layer 120L, and a semiconductor device layer MCL on a substrate 101.

The first electrode line layer 110L may include a plurality of first electrode lines 110 extending parallel to each other in a first direction (X direction). The second electrode line layer 120L may include a plurality of second electrode lines 120 arranged to be separated from the first electrode line layer 110L and extending parallel to each other in a second direction (Y direction). The first direction and the second direction may be different from each other, and may perpendicularly cross each other as in the X and Y directions of FIG. 4A, but are not limited thereto. In view of driving of the semiconductor apparatus, the plurality of first electrode lines 110 may correspond to one of a word line and a bit line, and the plurality of second electrode lines 120 may correspond to the other one.

The plurality of first electrode lines 110 and the plurality of second electrode lines 120 may each independently include a metal, a conductive metal nitride, a conductive metal oxide, or a combination these materials. For example, the plurality of first electrode lines 110 and the plurality of second electrode lines 120 may each independently include W, WN, Au, Ag, Cu, Al, TiAlN, Ir, Pt, Pd, Ru, Zr, Rh, Ni, Co, Cr, Sn, Zn, ITO, an alloy of these materials, or a combination of these materials. In addition, the plurality of first electrode lines 110 and the plurality of second electrode lines 120 may each independently include a metal film and a conductive barrier layer covering a part or all of the metal film. The conductive barrier layer may include, for example, Ti, TiN, Ta, TaN, or a combination thereof.

The semiconductor device layer MCL may include a plurality of semiconductor devices MC. The semiconductor devices MC may be arranged to be separated from each other, and may have a three-dimensional structure in which crossing points of the plurality of first electrode lines 110 and the plurality of the second electrode lines 120 are arranged between the plurality of first electrode lines 110 and the plurality of second electrode lines 120.

The semiconductor device MC may further include an electrode layer between a selection device layer 143 (SW of FIG. 1) and a variable resistance layer 149 (ME of FIG. 1) to electrically connect the selection device layer 143 to the variable resistance layer 149. In addition, an electrode layer may be further included between the first electrode lines 110 and the selection device layer 143 and/or between the second electrode lines 120 and the variable resistance layer 149. Specifically, the selection device layer 143 may be arranged between a first electrode layer 141 and a second electrode layer 145, and the variable resistance layer 149 may be arranged between the second electrode layer 145 and a third electrode layer 148.

The first electrode layer 141, the second electrode layer 145, and the third electrode layer 148 may be paths through which current flows, and may include a conductive material. The first electrode layer 141, the second electrode layer 145, and the third electrode layer 148 may each independently include a metal, a conductive metal nitride, a conductive metal oxide, or a combination of these materials. For example, the first electrode layer 141, the second electrode layer 145, and the third electrode layer 148 may each independently include one or more selected from carbon (C), titanium nitride (TiN), titanium silicon nitride (TiSiN), titanium carbon nitride (TiCN), titanium carbon silicon nitride (TiCSiN), titanium aluminum nitride (TiAlN), tantalum (Ta), tantalum nitride (TaN), tungsten (W), and tungsten nitride (WN).

The selection device layer 143 may be one of the selection device layers described above. For example, although the introduction position of a first chalcogen compound layer 143a and a second chalcogen compound layer 143b is not particularly limited, the first chalcogen compound layer 143a may be arranged closer to the first electrode layer 141 than the second chalcogen compound layer 143b, or the second chalcogen compound layer 143b may be arranged closer to the variable resistance layer 149 and/or the second electrode layer 145 than the first chalcogen compound layer 143a. According to another embodiment, in the selection device layer 143, the concentration of the fourth element is greater at a position adjacent to the second electrode layer 145 than the first electrode layer 141, or the concentration of the fourth element may be maximum at a desired and/or alternatively predetermined thickness position in the selection device layer 143. In addition, in the selection device layer 143, the concentration of the fifth element is less in a position adjacent to the second electrode layer 145 than the first electrode layer 141, or the concentration of the fifth element may be minimum at a desired and/or alternatively predetermined thickness position in the selection device layer 143.

Also, the semiconductor device MC may not include an insulating material between the first electrode layer 141 and the selection device layer 143 and/or between the second electrode layer 145 and the selection device layer 143. The insulating material may include a metal oxide and/or a metal nitride, or may include a silicon oxide, a silicon nitride, or a silicon nitride oxide.

The variable resistance layer 149 may include a material having resistance change characteristics according to an applied condition.

According to an embodiment, the variable resistance layer 149 may include a material capable of reversibly changing a phase according to temperature. In other words, the variable resistance layer 149 may include a material capable of reversibly changing a phase between crystalline and amorphous according to a heating time (applied heat amount). Specifically, the variable resistance layer 149 may include a material capable of reversibly changing a phase between a crystalline state and an amorphous state by Joule heat generated when an external electrical pulse is applied (to the variable resistance layer 149), and a resistance of which is changed due to the phase change. For example, the phase change material may be in a high resistance state in an amorphous phase and a low resistance state in a crystalline phase. By defining the high resistance state as '0' and the low resistance state as '1', data may be stored in the variable resistance layer 149.

The phase change material may include selenium (Se) and/or tellurium (Te), and may include one or more selected from Ge, Sb, Bi, Pb, Sn, Ag, As, S, Si, In, Ti, Ga, P, B, O and C. The phase change material may include Ge—Sb—Te (GST). For example, Ge—Sb—Te (GST) is a compound containing Ge, Sb, and Te, and may include $Ge_2Sb_2Te_5$, $Ge_2Sb_2Te_7$, $Ge_1Sb_2Te_4$, and/or $Ge_1Sb_4Te_7$.

The phase change material may further include one or more metal elements selected from aluminum (Al), zinc (Zn), chromium (Cr), manganese (Mn), iron (Fe), cobalt (Co), nickel (Ni), molybdenum (Mo), ruthenium (Ru), palladium (Pd), hafnium (Hf), tantalum (Ta), iridium (Ir), platinum (Pt), zirconium (Zr), thallium (Tl), and polonium (Po). The metal element may increase electrical conductivity and thermal conductivity of the variable resistance layer 149 and may increase a crystallization rate.

Each element constituting the phase change material may have various chemical composition ratios (stoichiometry). According to the chemical composition ratio of each element, the crystallization temperature, melting point, phase change rate according to crystallization energy, and information retention of the phase change material may be controlled. For example, the chemical composition ratio may be controlled so that the melting point of the phase change material is in a range from about 500° C. to about 800° C.

The variable resistance layer 149 may have a multilayer structure in which a plurality of layers including different materials are alternately stacked. For example, the variable resistance layer 149 may have a structure in which a layer including Ge—Te and a layer including Sb—Te are alternately stacked. The stack structure may be a super-lattice structure. In addition, a barrier layer may be further included between the plurality of layers. The barrier layer may limit and/or prevent material diffusion between the plurality of layers.

The semiconductor device MC may further include a heating electrode layer 147 capable of heating the variable resistance layer 149. The heating electrode layer 147 may be arranged between the second electrode layer 145 and the variable resistance layer 149 to contact the variable resistance layer 149. The heating electrode layer 147 may include a conductive material capable of generating heat sufficient to cause a phase change in the variable resistance layer 149 without reacting with the variable resistance layer 149. The heating electrode layer 147 may include a carbon-based conductive material. For example, the heating electrode layer 147 may include TiN, TiSiN, TiAlN, TaSiN, TaAlN, TaN, WSi, WN, TiW, MoN, NbN, TiBN, ZrSiN, WSiN, WBN, ZrAlN, MoAlN, TiAl, TiON, TiAlON, WON, TaON, carbon (C), silicon carbide (SiC), silicon carbon nitride (SiCN), carbon nitride (CN), titanium carbon nitride (TiCN), tantalum carbon nitride (TaCN), or a combination these materials.

The second electrode layer 145 may be formed to have a thickness by which heat generated by the heating electrode layer 147 does not substantially affect the selection device layer 143. The second electrode layer 145 may be formed to have a thickness greater than that of the first electrode layer 141 or the third electrode layer 148 and may have a thickness in a range from about 10 nm to about 100 nm. In addition, the second electrode layer 145 may further include a thermal barrier layer, and may have a structure in which the thermal barrier layer and an electrode material layer are alternately stacked. The heating electrode layer 147 is for heating the variable resistance layer 149, which includes a material capable of changing a phase by heat, and the heating electrode layer 147 may be omitted in the following embodiments in which the material of the variable resistance layer 149 is a different material.

According to another embodiment, the variable resistance layer 149 may include a material capable of reversibly changing the magnitude of an electrical resistance while a defect in a compound moves according to an externally applied voltage. For example, the variable resistance layer 149 may include a transition metal oxide. The transition metal oxide is a metal oxide in which an electrical path is formed/depleted as an oxygen vacancy moves according to an externally applied voltage and may be reversibly changed into a low resistance state and a high resistance state. The transition metal oxide may include a metal selected from one or more of Ta, Zr, Ti, Hf, Mn, Y, Ni, Co, Zn, Nb, Cu, Fe, and Cr. For example, the transition metal oxide may include one or more of $Ta_2O_{5-x}$, $ZrO_{2-x}$, $TiO_{2-x}$, $HfO_{2-x}$, $MnO_{2-x}$, $Y_2O_{3-x}$, $NiO_{1-y}$, $Nb_2O_{5-x}$, $CuO_{1-y}$, and $Fe_2O_{3-x}$ ($0 \leq x \leq 1.5$ and $0 \leq y \leq 5$).

According to still another embodiment, the variable resistance layer 149 may include a material capable of reversibly changing an electrical resistance while changing a polarization state according to an externally applied voltage. For example, the variable resistance layer 149 may include a perovskite compound. The variable resistance layer 149 may include one or more of a niobium oxide, titanium oxide, nickel oxide, zirconium oxide, vanadium oxide, (Pr, Ca) $MnO_3$ (PCMO), strontium-titanium oxide, barium-strontium-titanium oxide, strontium-zirconium oxide, barium-zirconium oxide, and barium-strontium-zirconium oxide.

According to another embodiment, the variable resistance layer 149 may be a material capable of reversibly changing an electrical resistance while a magnetization state is changed according to an externally applied voltage. The variable resistance layer 149 may have a magnetic tunnel junction (MTJ) structure. Specifically, the variable resistance layer 149 may include two electrodes including a magnetic material and a dielectric between the two magnetic electrodes. The two electrodes including a magnetic material may be a magnetized fixed layer and a magnetized free layer, respectively, and a dielectric therebetween may be a tunnel barrier layer. The magnetized fixed layer has a magnetization direction fixed in one direction, and the magnetization direction of the magnetization free layer may be changed by spin torque of internal electrons. Specifically, the magnetization direction of the magnetization free layer may be reversibly changed so as to be parallel or antiparallel to the magnetization direction of the magnetization fixed layer, and the variable resistance layer 149 may be reversibly changed into a high resistance state and a low resistance state according to the magnetization direction of the magnetization free layer. The magnetized fixed layer and the magnetized free layer may include a ferromagnetic material, and the magnetized fixed layer may further include an antiferromagnetic material that fixes the magnetization direction of the internal-ferromagnetic material. In addition, the tunnel barrier layer may include one or more oxides selected from Mg, Ti, Al, MgZn, and MgB.

The semiconductor device MC may have a pillar shape. For example, as shown in FIGS. 4A and 4B, the semiconductor device MC may have a rectangular pillar shape and may have various pillar shapes, such as a cylindrical shape, an elliptical pillar shape, and a polygonal pillar shape.

Also, as shown in FIGS. 4A and 4B, a side surface of the semiconductor device MC may be perpendicular to the substrate 101. In other words, an area of the cross-section perpendicular to a stacking direction (Z direction) of the semiconductor device MC may be constant, but this is an example, and the semiconductor device MC may have a structure in which a lower portion may have a greater area than an upper portion or the upper portion may have a greater area than the lower portion. In addition, areas of the upper portion and the lower portion of each of the first electrode layer 141, the second electrode layer 145, the heating electrode layer 147, the third electrode layer 148, the selection device layer 143, and the variable resistance layer 149 may be independently the same as or different from each other. This shape may vary depending on how each component is formed. For example, the first electrode layer 141 and the selection device layer 143 may have a structure in which an area of the upper portion is greater than that of the lower portion by being formed through a damascene process, and the second electrode layer 145, the heating electrode layer 147, the third electrode layer 148, and the variable resistance layer 149 may have a structure in which side surfaces thereof are perpendicular to the substrate 101 by being formed through a relief etching process.

An insulating layer may further be arranged between the first electrode lines 110, between the second electrode lines 120, and/or between the semiconductor devices MC. Specifically, a first insulating layer 160*a* may be arranged between the first electrode lines 110, a second insulating layer 160*b* may be arranged between the separated semiconductor devices MC of the semiconductor device layer MCL, and a third insulating layer 160*c* may be arranged between the second electrode lines 120. The first insulating layer 160*a*, the second insulating layer 160*b*, and/or the third insulating layer 160*c* may include a dielectric material including oxide and/or nitride, and may include the same material as or different materials from each other. Also, the first insulating layer 160*a*, the second insulating layer 160*b*, and/or the third insulating layer 160*c* may be an air gap. In this case, an insulating liner (not shown) may be formed between the first electrode lines 110, the second electrode lines 120, or the semiconductor device MC and the air gap.

The substrate 101 may include a semiconductor material, for example, silicon (Si), germanium (Ge), silicon germanium (SiGe), silicon carbide (SiC), gallium arsenic (GaAs), indium arsenic (InAs), indium phosphide (InP), etc., and may include an insulating material, such as silicon oxide, silicon nitride, or silicon oxynitride.

The semiconductor apparatus 100 may further include an interlayer insulating layer 105 on the substrate 101. The interlayer insulating layer 105 may be arranged between the substrate 101 and the first electrode line layer 110L, to electrically separate them. The interlayer insulating layer 105 may include an oxide, such as silicon oxide, and/or a nitride, such as silicon nitride.

Figure 4C:
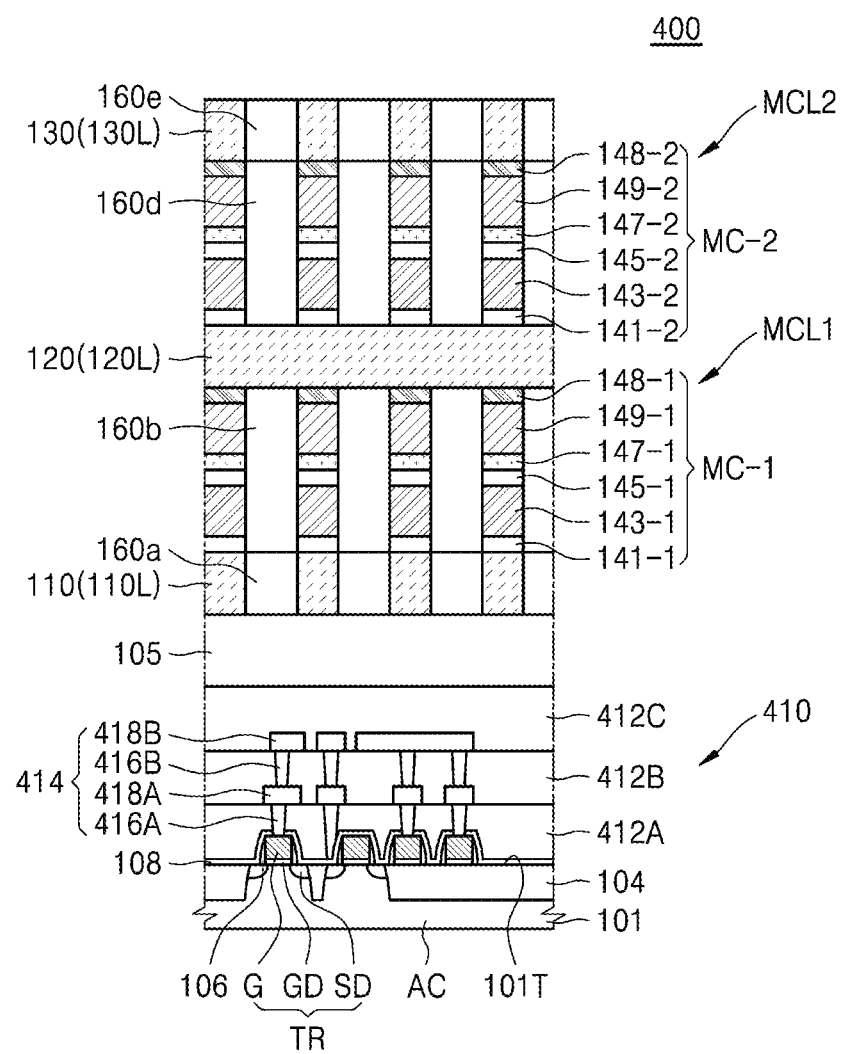
FIG. 4C is a schematic cross-sectional view of a semiconductor apparatus according to another embodiment.

The semiconductor apparatus may include at least two semiconductor device layers MCL. FIG. 4C is a schematic cross-sectional view of a semiconductor apparatus 400 according to another embodiment. Referring to FIG. 4C, the semiconductor apparatus 400 may include a first electrode line layer 110L, a second electrode line layer 120L, a third electrode line layer 130L, a first semiconductor device layer MCL1, and a second semiconductor device layer MCL2 on a substrate 101. The first semiconductor device layer MCL1 may include a plurality of first semiconductor devices MC-1, and the second semiconductor device layer MCL2 may include a plurality of second semiconductor devices MC-2. The first semiconductor device MC-1 may include a first electrode layer 141-1, a selection device layer 143-1, a second electrode layer 145-1, a heating electrode layer 147-1, a variable resistance layer 149-1, and a third electrode layer 148-1, and the second semiconductor device MC-2 includes a first electrode layer 141-2, a selection device layer 143-2, a second electrode layer 145-2, a heating electrode layer 147-2, a variable resistance layer 149-2, and a third electrode layer 148-2. Materials of these layers may be substantially the same as the materials of the first electrode layer 141, the selection device layer 143, the second electrode layer 145, the heating electrode layer 147, the variable resistance layer 149, and the third electrode layer 148 described above. The first semiconductor device layer MCL1 may be arranged between the first electrode line layer 110L and the second electrode line layer 120L, and the second semiconductor device layer MCL2 may be arranged between the second electrode line layer 120L and the third electrode line layer 130L. A fourth insulating layer 160*d* may be arranged between the second semiconductor devices MC-2, and a fifth insulating layer 160*e* may be arranged between the third electrode lines 130.

Specifically, the first electrode line layer 110L and the third electrode line layer 130L may extend in the same direction (first direction, X direction) and may be separated from each other in a third direction (Z direction). In addition, the second electrode line layers 120L may extend in the second direction (Y direction), and may be arranged to be separated from each other in the third direction (Z direction) between the first electrode line layer 110L and the third electrode line layer 130L. The first semiconductor device layer MCL1 may be arranged at a crossing point between the first electrode line layer 110L and the second electrode line layer 120L, and the second semiconductor device layer MCL2 may be arranged at a crossing point between the second electrode line layer 120L and the third electrode line layer 130L. In view of driving of the semiconductor apparatus 400, the first electrode line layer 110L and the third electrode line layer 130L may be word lines (or bit lines), and the second electrode line layer 120L may be a common bit line (or common word line).

FIG. 4C illustrates a semiconductor apparatus 400 having two semiconductor device layers MCL1 and MCL2, the number of semiconductor device layers and the number of electrode line layers may be appropriately adjusted according to a desired performance level.

The semiconductor apparatus 400 may further include a driving circuit region on the substrate 101. Referring to FIG. 4C, the driving circuit region 410 may include circuit units, such as peripheral circuits, driving circuits, and core circuits that drive the semiconductor devices MC-1 and MC-2 or perform arithmetic processing. The circuits may include, for example, a page buffer, a latch circuit, a cache circuit, a column decoder, a sense amplifier, and a data in/out circuit, a row decoder, etc. Also, the circuits may be arranged between the substrate 101 and the semiconductor device layer MCL. In other words, the driving circuit region 410 and the semiconductor device layers MCL1 and MCL2 may be sequentially arranged on the substrate 101, and this arrangement structure may be a cell on peri (COP) structure.

The driving circuit region 410 may include one or more transistors TR and a wiring structure 414 electrically connected to the transistors TR.

The transistor TR may be arranged on an active region AC of the substrate 101 defined by a device isolation layer 104. The transistor TR may include a gate G, a gate insulating layer GD, and a source/drain SD. In addition, the insulating spacer 106 may be disposed on both sidewalls of the gate G, and an etch stopper 108 may be arranged on the gate G and/or the insulating spacer 106. The etch stopper 108 may include an insulating material, such as silicon nitride or silicon oxynitride.

The wiring structures 414 may be arranged in an appropriate number and positions according to the layout of the driving circuit region 410 and the type and arrangement of the gates G. The wiring structure 414 may have a multilayer structure of two or more layers. Specifically, as shown in FIG. 4C, the wiring structure 414 includes a first contact 416A, a first wiring layer 418A, a second contact 416B, and a second wiring layer 418B that are electrically connected to each other and may be sequentially stacked on the substrate 101. The first contact 416A, the first wiring layer 418A, the second contact 416B, and the second wiring layer 418B may each independently include a metal, a conductive metal nitride, a metal silicide, or a combination thereof, or a conductive material, such as tungsten, molybdenum, titanium, cobalt, tantalum, nickel, tungsten silicide, titanium silicide, cobalt silicide, tantalum silicide, nickel silicide, etc.

The wiring structure 414 may include interlayer insulating layers 412A, 412B, and 412C to electrically separate each component. Referring to FIG. 4C, the interlayer insulating layers 412A, 412B, and 412C may be arranged between a plurality of transistors TR, between a plurality of wiring layers 418A and 4188, and/or between a plurality of contacts 416A and 4168. The interlayer insulating layers 412A, 4128, and 412C may include silicon oxide, silicon oxynitride, or the like.

The semiconductor apparatus 400 may further include a wiring structure (not shown) electrically connecting the semiconductor devices MC-1 and MC-2 and the driving circuit region 410, and the wiring structure (not shown) may be arranged through an interlayer iron layer 105.

The selection device layer described above may constitute a switching device together with two electrodes arranged on both sides thereof as shown in FIGS. 3A to 3C. Specifically, the switching device may be used in various technical fields for the purpose of controlling the flow of current according to changes in current and/or voltage. For example, the switching device may be used in place of a P-N diode in a technical field in which a P-N diode is used. For the two electrodes and the selection device layer of the switching device, the descriptions of the first electrode layer 141, the second electrode layer 145, and the selection device layer 143 of FIG. 4A may be referred.

Switching devices, semiconductor devices, and/or semiconductor apparatuses according to embodiments may have a threshold voltage $V_{th}$ of 2.5V or more, 2.6V or more, 2.7V or more, 2.8V or more, 2.9V or more, 3.0V or more, 5.0V or less, 4.9V or less, 4.7V or less, 4.6V or less, or 4.5V or less.

The switching device, the semiconductor device, and/or the semiconductor device according to the embodiments may have high durability. For example, the switching device, the semiconductor device, and/or the semiconductor apparatus may have an endurance of $5.0\times10^7$ times or more, $1.0\times10^8$ times or more, $5.0\times10^8$ times or more, $1.0\times10^9$ times or more, or $5.0\times10^8$ times or more. The endurance may be defined as the number of on-off operations with a threshold voltage $V_{th}$ (an average value of threshold voltages during 1000 on-off cycles) within ±15% of the initial threshold voltage by using a pulse with a voltage rise and fall time of 10 ns and a width of 100 ns. In addition, the switching device, the semiconductor device, and/or the semiconductor apparatus may have a threshold voltage variation ($V_{th}$_drift value) of 60 mV/dec or 55 mV/dec or less.

Figure 5A:
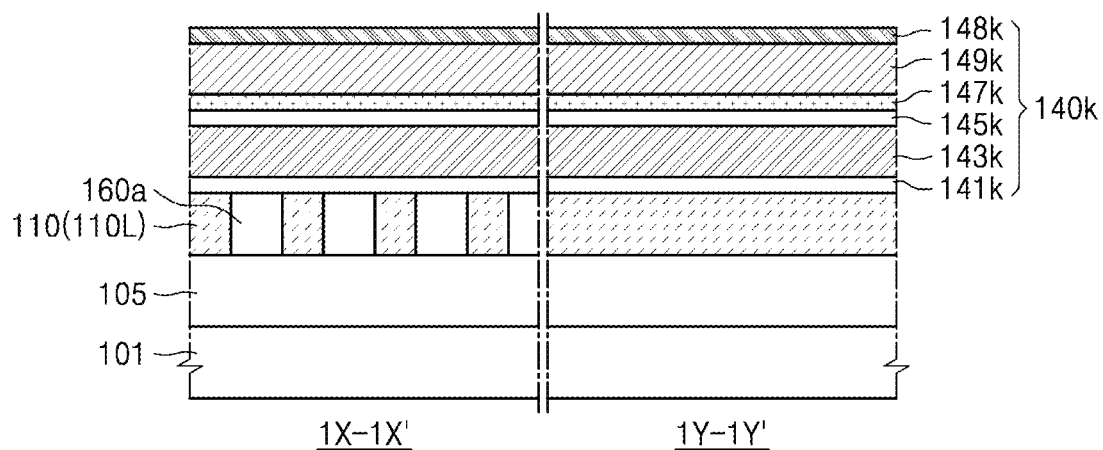
FIGS. 5A to 5C are schematic diagrams illustrating a manufacturing process of a semiconductor apparatus according to an embodiment.
Figure 5B:
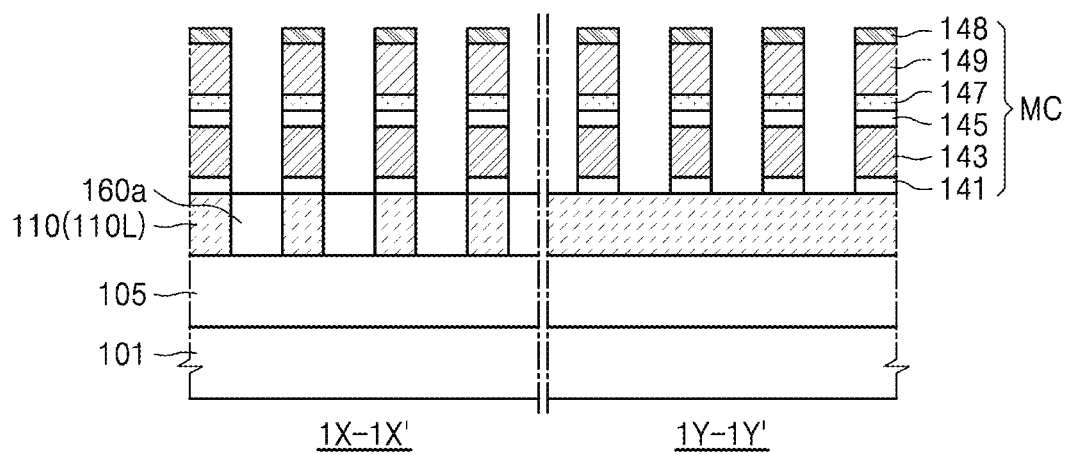
Figure 5C:
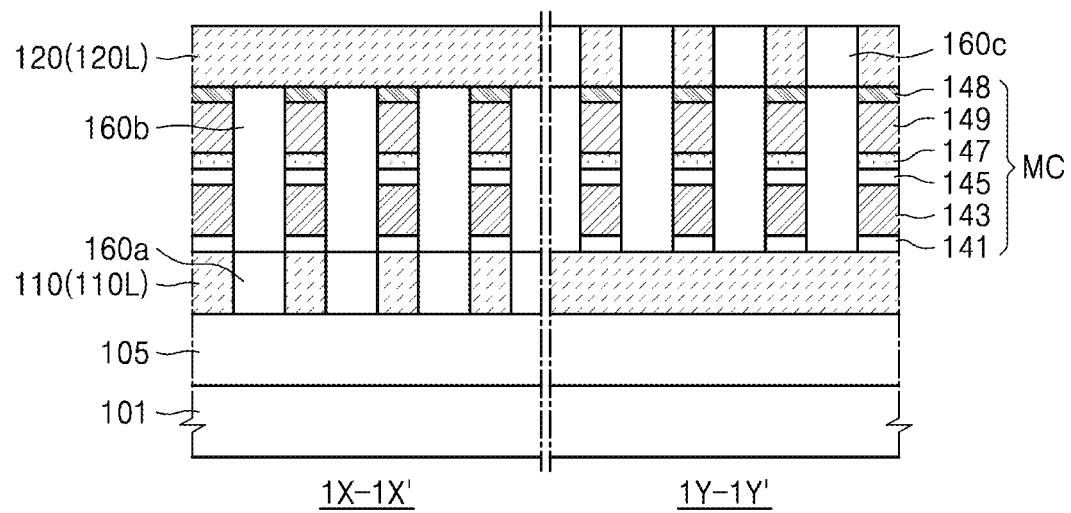

The switching device, the semiconductor device, and/or the semiconductor apparatus may be manufactured according to methods of the related art. FIGS. 5A to 5C are cross-sectional views illustrating a process of manufacturing a semiconductor device according to an embodiment.

Referring to FIG. 5A, an interlayer insulating layer 105 is formed on a substrate 101. A first electrode line layer 110L including a plurality of first electrode lines 110 extending in a first direction (X direction) and separated from each other is formed on the interlayer insulating layer 105. The first electrode line layer 110L may be formed by forming a conductive layer for a first electrode line and patterning the conductive layer through etching. A first insulating layer 160a may be filled between the first electrode lines 110. The first insulating layer 160a may be formed where, after filling gaps between the first electrode lines 110 with an insulating material, the resultant product is planarized so that upper surfaces of the first electrode lines 110 are exposed through a CMP process or the like. A stack structure 140k is formed by sequentially stacking a first electrode material layer 141k, a selection device material layer 143k, a second electrode material layer 145k, and a heating electrode material layer 147k, a variable resistance material layer 149k, and a third electrode material layer 148k on the first electrode line layer 110L and the first insulating layer 160a.

Referring to FIG. 5B, a mask pattern (not shown) separated from each other in a first direction (X direction) and a second direction (Y direction) is formed on the stack structure 140k, and using the mask pattern, the stack structure 140k is etched so that parts of the upper surfaces of the first insulating layer 160a and the first electrode lines 110 are exposed. According to the structure of the mask pattern, a plurality of semiconductor devices MC separated from each other in the first direction and the second direction may be formed. Each of the plurality of semiconductor devices MC includes a first electrode layer 141, a selection device layer 143, a second electrode layer 145, a heating electrode layer 147, a variable resistance layer 149, and a third electrode layer 148, and may be electrically connected to the first electrode lines 110. Also, the remaining mask pattern may be removed through ashing and stripping processes.

Referring to FIG. 5C, a second insulating layer 160b may be filled between the plurality of semiconductor devices MC. A second electrode line layer 120L including a plurality of second electrode lines 120 extending in the second direction (X direction) and separated from each other is formed on the semiconductor devices MC and the second insulating layer 160b. A third insulating layer 160c may be filled between the second electrode lines 120.

The first and second electrode lines 110 and 120, the first, second, and third electrode layers 141, 145, and 148, the heating electrode layer 147, the insulating layers 105, 160a, 160b, and 160c, the selection device layer 143, and the variable resistance layer 149, may be formed through a method known in the related art. Each of the components may be independently formed to have a desired composition and thickness through deposition methods, such as atomic layer deposition (ALD), chemical vapor deposition (CVD), physical vapor deposition (PVD), or sputtering, etc. For example, the selection device material layer 143k may be formed by using a source or target including a first element, a second element, a third element, and a fifth element and a source and target including a first element, a second element, a third element, and a fourth element on the first electrode layer 141 through a physical vapor deposition method (PVD) or a sputtering process.

Also, each of the components may be independently patterned through methods known in the related art. Specifically, not only the patterning method described above, but also a damascene method may be used. For example, in the case of forming the second electrode lines 120 by using a damascene process, after forming a thick insulating material layer between and over the plurality of semiconductor devices MC, a trench is formed by etching the insulating material layer. The trench may extend in the second direction and be formed to expose an upper surface of the variable resistance layer 149. The second electrode lines 120 may be formed by filling the trench with a conductive material and planarizing the trench. The second insulating layer 160b and the third insulating layer 160c may be formed as a one-body type.

Hereinafter, technical aspects of the semiconductor device will be described in more detail through the implemented embodiments. However, the descriptions of the embodiments should not be interpreted as limiting the scope of right.

Embodiment 1

A first electrode layer was formed through DC sputtering or ALD method.

A selection device layer was formed on the first electrode layer by sputtering. Specifically, a first chalcogen compound layer was formed by using a target including germanium (Ge), arsenic (As), and selenium (Se), and a second chalcogen compound layer was formed by using a target including indium (In), germanium (Ge), arsenic (As), and selenium (Se) on the first electrode layer. As a result, in the selection device layer, the concentration of indium (In) is greater at a position adjacent to the second electrode layer than at a position adjacent to the first electrode layer.

A second electrode layer was formed on the selection device layer through DC sputtering or an ALD method.

Embodiment 2

When forming the selection device layer, a semiconductor device was manufactured in the same manner as in Embodiment 1 except that the order of introduction of the target is changed. Specifically, a first chalcogen compound layer was formed by using a target including indium (In), germanium (Ge), arsenic (As), and selenium (Se), and a second chalcogen compound layer was formed by using a target including germanium (Ge), arsenic (As), and selenium (Se) on the first electrode layer. As a result, in the selection device layer, the concentration of indium (In) is greater at a position adjacent to the first electrode layer than at a position adjacent to the second electrode layer.

COMPARATIVE EXAMPLE 1

During a manufacturing process of a semiconductor device, without changing the composition of a target, the semiconductor device was manufactured in the same manner as in Embodiment 1 except that a selection device was formed by using only a target including indium (In), germanium (Ge), arsenic (As), and selenium (Se).

COMPARATIVE EXAMPLE 2

With respect to each of the semiconductor devices according to Embodiment 1, Embodiment 2, Comparative Example 1, and Comparative Example 2, a threshold voltage $V_{th}$, an off-current Ioff, a rate of change of the threshold voltage $V_{th}$_drift, and an endurance characteristic were measured and summarized in Table 1.

Electrical Characteristic Evaluation 1

With respect to each of the semiconductor devices according to Embodiment 1, Embodiment 2, Comparative Example 1, and Comparative Example 2, a threshold voltage $V_{th}$, an off-current Ioff, a rate of change of the threshold voltage $V_{th}$_drift, and an endurance characteristic were measured and summarized in Table 1.

Referring to Table 1, the semiconductor devices of Embodiments 1 and 2 show high threshold voltages $V_{th}$ similar to those of Comparative Example 1 and/or Comparative Example 2, and greater endurance characteristics compared to Comparative Examples 1 and 2. Also, the semiconductor devices of Embodiments 1 and 2 had a high rate of change of the threshold voltage $V_{th}$_drift compared to Comparative Example 1, and the semiconductor device of Embodiment 1 shows a less off-current value Ioff than that of Embodiment 2.

TABLE 1

| | Threshold voltage ($V_{th}$) (V) | Off-current ($I_{off}$) (A) | Rate of change of threshold voltage ($V_{th}$_drift) | Endurance |
|---|---|---|---|---|
| Embodiment 1 | 3.28 | 7.15E−10 | 53.83 | 1.00E+9 |
| Embodiment 2 | 3.23 | 1.30E−9 | 56.84 | 5.28E+8 |
| Comparative Example 1 | 3.5 | 5.87E−10 | 127.10 | 3.00E+8 |
| Comparative Example 2 | 3.25 | 1.25E−0.9 | 48.65 | 1.00E+8 |

Although the embodiments have been described in detail, the scope of rights is not limited to the embodiments, and various modifications and improvements by those skilled in the art using the basic concepts defined in the following claims also belong to the scope of the rights.

A chalcogen compound layer exhibiting ovonic threshold switching characteristics may be provided.

A switching device, a semiconductor device, and/or a semiconductor apparatus having a low off-current value (leakage current value) and high endurance may be provided. The device and/or apparatus may implement an improved degree of integration, and may contribute to miniaturization of electronic devices.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A semiconductor device comprising:
a first electrode;
a second electrode separated from the first electrode; and
a first chalcogen compound layer and a second chalcogen compound layer between the first electrode and the second electrode, wherein
the first chalcogen compound layer and the second chalcogen compound layer each independently include a first element selected from the group consisting of germanium (Ge) and tin (Sn) and a second element including one or more selected from the group consisting of sulfur (S), selenium (Se), and tellurium (Te), and
the first chalcogen compound layer and the second chalcogen compound layer have different compositions from each other,
wherein an energy band gap of the first chalcogen compound layer is greater than an energy band gap of the second chalcogen compound layer by an amount ranging from 0.1 eV to 1.0 eV.

2. The semiconductor device of claim 1, wherein the semiconductor device has ovonic threshold switching characteristics.

3. The semiconductor device of claim 1, wherein the first chalcogen compound layer has a greater energy band gap than the second chalcogen compound layer.

4. The semiconductor device of claim 1, wherein any one of the first chalcogen compound layer and the second chalcogen compound layer further comprises a third element including one or more selected from the group consisting of arsenic (As), antimony (Sb), silicon (Si), and bismuth (Bi).

5. The semiconductor device of claim 1, wherein the second chalcogen compound layer further comprises a fourth element including one or more selected from the group consisting of boron (B), aluminum (Al), scandium (Sc), manganese (Mn), strontium (Sr), and indium (In).

6. The semiconductor device of claim 1, wherein the first chalcogen compound layer further comprises a fifth element including one or more selected from the group consisting of carbon (C), nitrogen (N), oxygen (O), phosphorus (P), and sulfur (S).

7. The semiconductor device of claim 1, wherein the second chalcogen compound layer comprises a compound represented by Formula 1 or Formula 2 below:

[Formula 1]
$A_aB_bC_c$
[Formula 2]
$A_aB_bC_cD_d$
wherein, in Formula 1 or Formula 2,
A is the first element,
B is the second element,
C is a third element,
D is a fourth element,
a+b+c=1 in Formula 1, and
a+b+c+d=1 in Formula 2.

8. The semiconductor device of claim 1, wherein the first chalcogen compound layer comprises a compound represented by one of Formula 1, Formula 3, and Formula 4 below:

[Formula 1]
$A_aB_bC_c$
[Formula 3]
$A_aB_b$
[Formula 4]
$A_aB_bC_cE_e$
wherein, in Formula 1, Formula 3, or Formula 4,
A is the first element,
B is the second element,
C is a third element,
E is a fifth element,
a+b+c=1 in Formula 1,
a+b=1 in Formula 3, and
a+b+c+e=1 in Formula 4.

9. The semiconductor device of claim 1, wherein a volume ratio the second chalcogen compound layer with respect to the first chalcogen compound layer is an amount ranging from 0.1 to 1.5.

10. The semiconductor device of claim 1, further comprising:
a third chalcogen compound layer adjacent to the second chalcogen compound layer and separated from the first chalcogen compound layer.

11. The semiconductor device of claim 10, wherein the third chalcogen compound layer comprises a compound represented by one or more of Formulas 1, 3, and 4:

[Formula 1]
$A_aB_bC_c$
[Formula 3]
$A_aB_b$
[Formula 4]
$A_aB_bC_cE_e$
wherein, in Formula 1, Formula 3, or Formula 4,
A is the first element,
B is the second element,
C is a third element,
E is a fifth element,
a+b+c=1 in Formula 1,
a+b=1 in Formula 3, and
a+b+c+e=1 in Formula 4.

12. The semiconductor device of claim 10,
wherein the third chalcogen compound layer has a greater energy band gap than the second chalcogen compound layer.

13. A semiconductor apparatus comprising:
a plurality of first electrode lines on a substrate, parallel to an upper surface of the substrate, and extending in a first direction;
a plurality of second electrode lines on the plurality of first electrode lines, parallel to the upper surface of the substrate, and extending in a second direction that is different from the first direction; and
a first semiconductor device arranged at a crossing point between each of the plurality of first electrode lines and the plurality of second electrode lines, and the first semiconductor device including the semiconductor device of claim 1.

14. The semiconductor apparatus of claim 13, further comprising:
a plurality of third electrode lines on the plurality of first electrode lines and the plurality of second electrode lines and the plurality of third electrode lines extending in the first direction; and
a second semiconductor device at a crossing point between each of the plurality of second electrode lines and the plurality of third electrode lines,
wherein the second semiconductor device includes a first electrode, a second electrode separated from the first electrode, and a first chalcogen compound layer and a second chalcogen compound layer between the first electrode and the second electrode, and
wherein the first chalcogen compound layer and the second chalcogen compound layer each independently include a first element selected from the group consisting of germanium (Ge) and tin (Sn) and a second element including one or more selected from the group consisting of sulfur (S), selenium (Se), and tellurium (Te), and
the first chalcogen compound layer and the second chalcogen compound layer have different compositions from each other.

15. The semiconductor apparatus of claim 13, further comprising:
a circuit unit for driving the semiconductor device or performing a computation operation.

* * * * *